(12) United States Patent
Mengel et al.

(10) Patent No.: US 7,982,292 B2
(45) Date of Patent: Jul. 19, 2011

(54) SEMICONDUCTOR DEVICE

(75) Inventors: Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 282 days.

(21) Appl. No.: 12/197,462

(22) Filed: Aug. 25, 2008

(65) Prior Publication Data

US 2010/0044842 A1 Feb. 25, 2010

(51) Int. Cl.
*H01L 23/495* (2006.01)

(52) U.S. Cl. ......... 257/676; 257/E21.499; 257/E21.001; 257/E23.031; 438/121; 438/123

(58) Field of Classification Search .......... 257/670–733, 257/787–796, E23.001–E23.194
See application file for complete search history.

(56) References Cited

U.S. PATENT DOCUMENTS

| | | | |
|---|---|---|---|
| 5,637,922 A | 6/1997 | Fillion et al. | |
| 7,492,043 B2* | 2/2009 | Choi et al. | 257/724 |
| 7,524,775 B2* | 4/2009 | Ewe et al. | 438/778 |
| 2002/0094491 A1* | 7/2002 | Kresge et al. | 430/280.1 |
| 2007/0126129 A1* | 6/2007 | Ahn et al. | 257/783 |

FOREIGN PATENT DOCUMENTS

| | | |
|---|---|---|
| WO | 01/75961 A1 | 10/2001 |
| WO | 2004/077548 A2 | 9/2004 |

\* cited by examiner

*Primary Examiner* — N Drew Richards
*Assistant Examiner* — Mamadou Diallo
(74) *Attorney, Agent, or Firm* — Dicke, Billig & Czaja, PLLC

(57) ABSTRACT

A semiconductor device includes a carrier, a chip coupled to the carrier, a dielectric layer coupled to the carrier and the chip, and conducting elements connected to both the carrier and contacts of the chip. The chip includes a first face with a first contact spaced apart from a second contact. The dielectric layer includes a photoinitiator that configures the dielectric layer to be selectively opened to expose the first and second contacts and the carrier. A first conducting element is connected to the first contact, a second conducting element is connected to the second contact, and a third conducting element is connected to the carrier.

20 Claims, 6 Drawing Sheets

SEMICONDUCTOR DEVICE

BACKGROUND

Market demand for smaller and more functional electronics has driven the development of semiconductor devices, including semiconductor power packages and entire systems disposed on a chip. Some electronic devices, such as cellular telephones, employ a variety of design-specific electronic components. Other electronic devices, such as power packages utilized in the automotive industry, employ one or more logic chips connected to a carrier and one or more power transistors connected to the carrier and the logic chip(s). The space available inside the electronic devices is limited, particularly as the electronic devices are made smaller.

Wire bonds are employed in some known semiconductor packages to electrically connect the chip(s) to the carrier. The wire bonds are time consuming to connect, but when attached, provide a first level interconnect to the chip. When the chips in power packages are wirebonded, the wires are typically provided with diameters of between 50-500 micrometers to enable sufficient current flow to/from the chips. Wires with diameters of between 50-500 micrometers are relatively large and thus limit miniaturization of the packages. In addition, these conventional semiconductor packages have a relatively low input/output density.

Both the manufacturers and consumers of electronic devices desire devices that are reduced in size and yet have increased device functionality.

For these and other reasons there is a need for the present invention.

SUMMARY

One aspect provides a semiconductor device including a carrier, a chip coupled to the carrier, a dielectric layer coupled to the carrier and the chip, and conducting elements connected to both the carrier and contacts of the chip. The chip includes a first face with a first contact spaced apart from a second contact. The dielectric layer includes a photoinitiator that configures the dielectric layer to be selectively opened to expose the carrier and the first and second contacts. A first conducting element is connected to the first contact, a second conducting element is connected to the second contact, and a third conducting element is connected to the carrier.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a semiconductor device, such as a power device, including at least one chip attached to a carrier and conducting elements attached to the chip and the carrier. The conducting elements are structured to have an increased surface area connected to contacts of the chips and to a portion of the carrier as compared to conventional wire bonded connections. The increased surface area of the conducting elements provides improved electrical connection and heat dissipation as compared to wire bonded connections.

Figure 1:
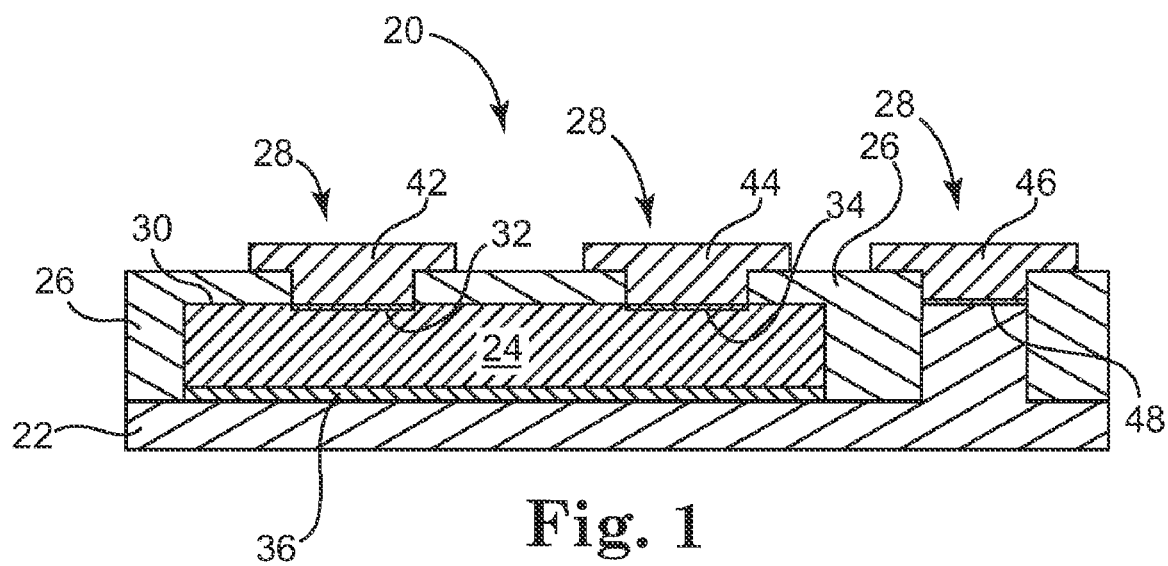
FIG. 1 is a schematic cross-sectional view of a semiconductor device including a chip electrically connected to a carrier according to one embodiment.

FIG. 1 is a schematic cross-sectional view of a semiconductor device 20 according to one embodiment. Semiconductor device 20 includes a carrier 22, a chip 24 coupled to carrier 22, a dielectric layer 26 coupled to carrier 22 and chip 24, and conducting elements 28 extending through dielectric layer 26 to electrically connect with carrier 22 and chip 24.

In one embodiment, chip 24 includes a first face 30 having a first contact 32 spaced apart from a second contact 34 and a second face 36 attached to carrier 22. Dielectric layer 26 includes a photoinitiator that configures dielectric layer 26 to be selectively opened to provide openings that expose carrier 22 and the first and second contacts 32, 34. The openings are configured to provide more surface area for electrical connection to carrier 22 and chip 24 as compared to wire bonded connections. The increased area of connection reduces electrical resistance and heating and provides improved electrical performance for semiconductor device 20. The conducting elements 28 achieve an increased area of connection and include a first conducting element 42 connected to first contact 32, a second conducting element 44 connected to second contact 34, and a third conducting element 46 connected to a portion 48 of carrier 22.

In this specification, photoinitiator means a compound that, upon absorption of light, undergoes a photoreaction that produces reactive species and/or changes the solubility of the dielectric layer 26. Suitable photoinitiators are described below. In one embodiment, dielectric layer 26 is a polymer compound having a photoinitiator configured to promote a change in dielectric layer 26 after exposure to a light source, which enable structuring dielectric layer 26 to include contact holes/openings. Dielectric layer 26 is typically masked with a resist layer and photostructured.

Figure 2:
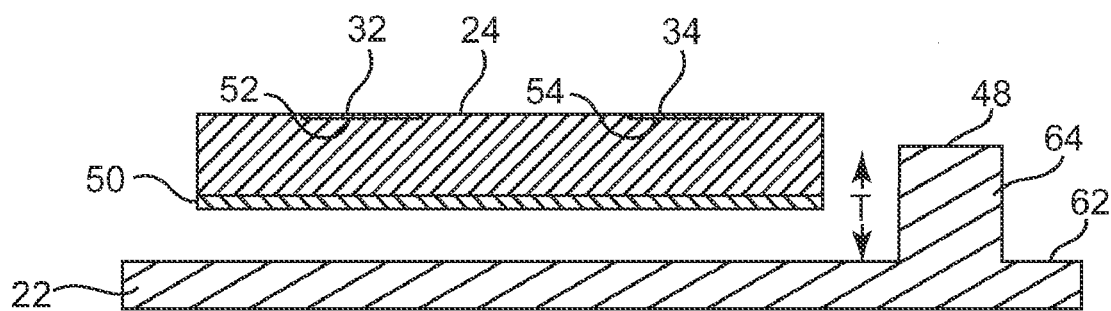
FIG. 2 is a cross-sectional view of the chip prepared for attachment to the carrier as illustrated in FIG. 1.

FIG. 2 is a cross-sectional view of carrier 22 prepared for chip 24 attachment along an interface 50.

Carrier 22 provides a support structure for the assembly 20 of integrated power packages and includes substrates or leadframes. Substrates include laminated substrates, flex substrates, ceramic substrates, or silicon substrates. Leadframes include frames formed of metal such as copper, aluminum, alloys of copper, alloys of aluminum, or other suitable electrically conducting metals. In one embodiment, carrier/leadframe 22 includes a quad flat package (QFP) leadframe having leads on four sides. In one embodiment, leadframe 22 includes a dual flat no-lead (DFN) leadframe having leads on two opposing sides. In one embodiment, leadframe 22 includes a non-leaded very-thin quad flat no-lead (VQFN) leadframe.

In one embodiment, leadframe 22 is a copper leadframe suited for use in power applications and includes a pillar 64 extending from a base 62. In one embodiment, pillar 64 extends a distance T between base 62 and planar portion 48 to form a drain that is in electrical contact with base 62. In one embodiment, pillar/drain 64 is integrally formed as a single unit with carrier/leadframe 22 and planar portion 48 is co-planar with the first and second contacts 32, 34. In one embodiment, interface 50, chip 24, and contacts 32, 34 combine to extend the distance T above leadframe 22 such that contacts 32, 34 are co-planar with planar portion 48 of pillar 64. In one example, the thickness of interface 50 is approximately 5-50 micrometers, the thickness of chip 24 is approximately 40-60 micrometers, and the thickness of contacts 32, 34 is approximately 15-40 micrometers such that the distance T is between approximately 80-150 micrometers.

Chip 24 includes semiconductor chips in general and can include any chip suitable for use in a semiconductor package, such as logic chips, power chips, metal oxide semiconductor field effect transistor chips and the like.

In one embodiment, interface 50 forms an electrical connection between chip 24 and carrier 22 and includes diffusion brazed material, solder, electrical connection paste, lead blobs, or electrical guidance sticking. In one embodiment, interface 50 is an electrically conductive adhesive that connects chip 24 to carrier 22. In one embodiment, interface 50 is a double-sided electrically conductive adhesive tape, although other suitable adhesives and/or attachment mechanisms are also acceptable.

In one embodiment, first contact 32 is a metal contact that is connected to a first pad 52 on chip 24, and second contact 34 is a metal bump electrically connected to a second pad 54 of chip 24. In one embodiment, first pad 52 is provided as a source pad and second pad 54 is provided as a gate pad, where the respective source and gate pads 52, 54 are provided at the wafer level. Contacts 32, 34 are fabricated to electrically connect with their respective pads 52, 54. In one embodiment, contacts 32, 34 are formed of an electrically conductive metal such as silver, copper, gold, nickel, alloys of these metals, or other suitable conductive material.

Figure 3:
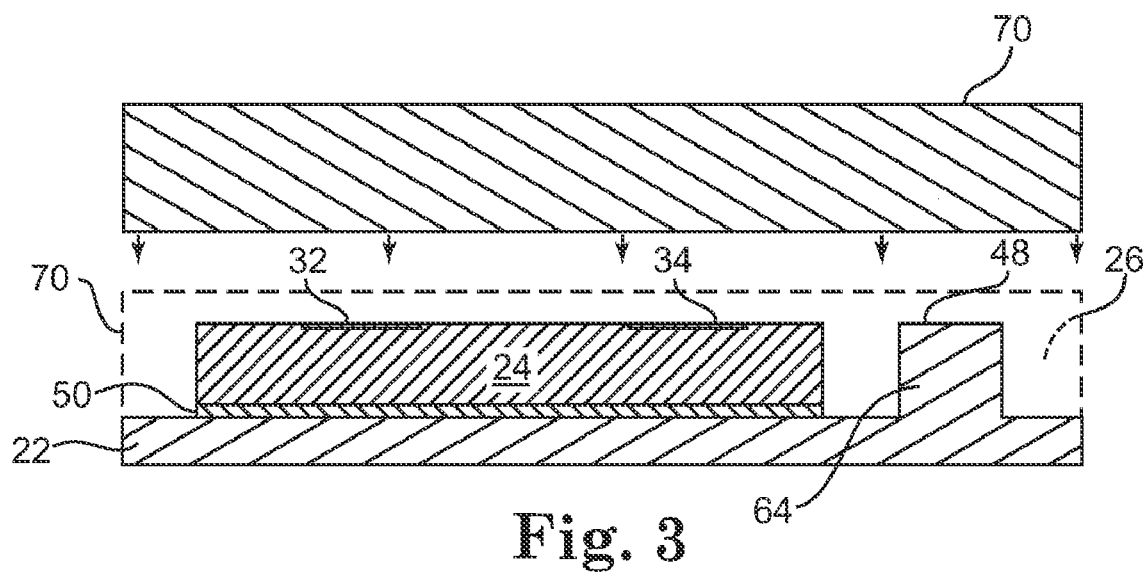
FIG. 3 is a schematic cross-sectional view of a monolithic foil including a photoinitiator and configured to be capped over the chip and the carrier according to one embodiment.

FIG. 3 is a schematic cross-sectional view of dielectric layer 26 provided as a monolithic foil 70. In one embodiment, monolithic foil 70 is an epoxy, an acrylate, or polyimide-based polymer compound including a photoinitiator and is capped over chip 24 and carrier 22 in a single unit. In one embodiment, monolithic foil 70 is capped over chip 24 and carrier 22 with heat and pressure such that the dielectric material of monolithic foil 70 flows between contacts 32, 34 of chip 24 and between chip 24 and pillar 64. Suitable monolithic foils 70 are formed of dielectric materials including, for example, epoxy and other resins.

The photoinitiator enables the selective patterning of dielectric layer 26. In one embodiment, the photoinitiator is patterned on dielectric layer 26 by spin coating and subsequently activated with an ultraviolet (UV) light source to open or expose planar portion 48 of carrier 22 and contacts 32, 34. In one embodiment, the photoinitiator is blended into the dielectric layer 26. In one embodiment, the photoinitiator is compounded with the dielectric layer 26. In one embodiment, the photoinitiator is provided as a separate layer on top of the dielectric layer 26.

The species produced by the photoinitiator are configured to initiate or catalyze chemical reactions that result in significant changes in the solubility and physical properties of the dielectric layer 26. In this regard, the photoinitiator is a compound configured to transform the physical energy of an incident light source into chemical energy in the form of reactive intermediates. Suitable photoinitiators include cationic photoinitiators, water soluble initiators, positive or negative photoinitiators. One suitable photoinitiator includes a photoacid generator having about 1 weight % triarylsulfonium hexafluoroantimonate salt, although other photoinitiators are also acceptable. This particular photoacid generator is a Lewis acid that generates a strong acid in the presence of a UV light source. The generated acid is employed to catalyze the crosslinking or polymerization of the epoxy resin of dielectric layer 26. One suitable photoinitiator includes epoxy-based negative photoresist identified as SU-8 photoinitiator available from MicroChem Corp., Newton, Mass.

Figure 4:
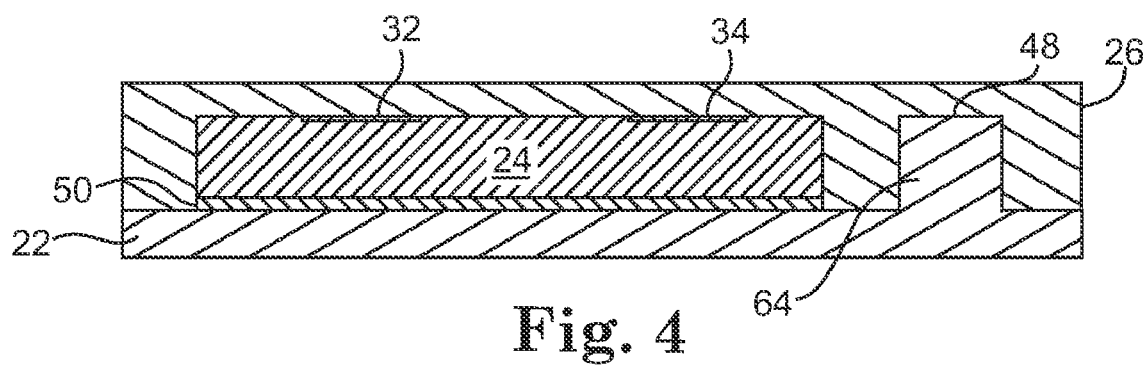
FIG. 4 is a schematic cross-sectional view of a dielectric layer including a photoinitiator disposed over the chip and the carrier according to one embodiment.

FIG. 4 is a schematic cross-sectional view of another embodiment of dielectric layer 26 disposed over chip 24 and carrier 22. In one embodiment, dielectric layer 26 is a resin that is spun over chip 24 and carrier 22 such that the dielectric material of layer 26 is deposited between contacts 32, 34 and between chip 24 and pillar 64. A photoinitiator in dielectric layer 26 enables the formation of openings that expose contacts 32, 34 of chip 24 and portion 48 of carrier 22.

Figure 5A:
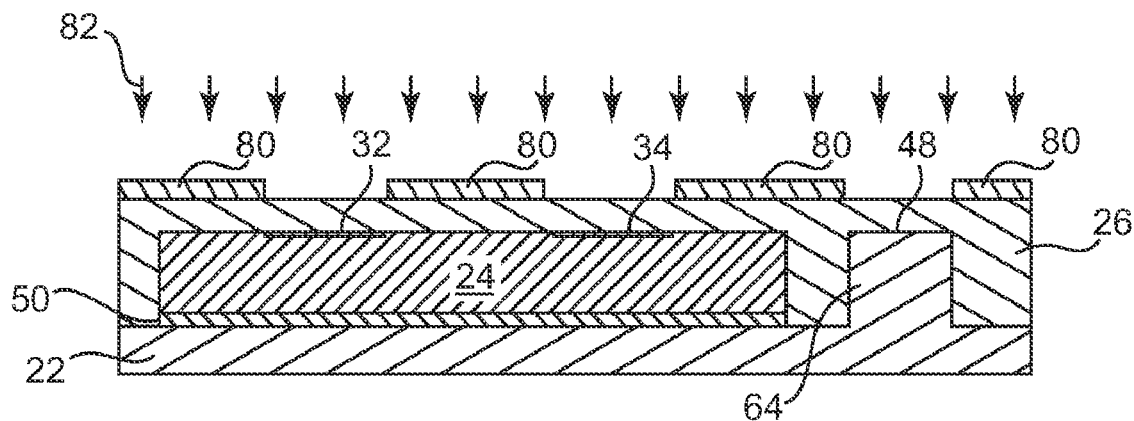
FIG. 5A is a schematic cross-sectional view of a negative photoresist mask applied over the dielectric layer and illuminated to photostructure the dielectric layer according to one embodiment.

FIG. 5A is a schematic cross-sectional view of a negative photoresist mask 80 disposed over dielectric layer 26 according to one embodiment. Negative photoresist mask 80 is patterned over dielectric layer 26 and becomes polymerized upon exposure to ultraviolet light 82. The polymerized (i.e., illuminated) resin of layer 26 becomes more difficult to dissolve. The negative photoresist mask 80 remains on the surface after illumination and a developer solution is employed to subsequently remove only the portions above contacts 32, 34 and portion 48 of carrier 22 (as shown in FIG. 6).

Figure 5B:
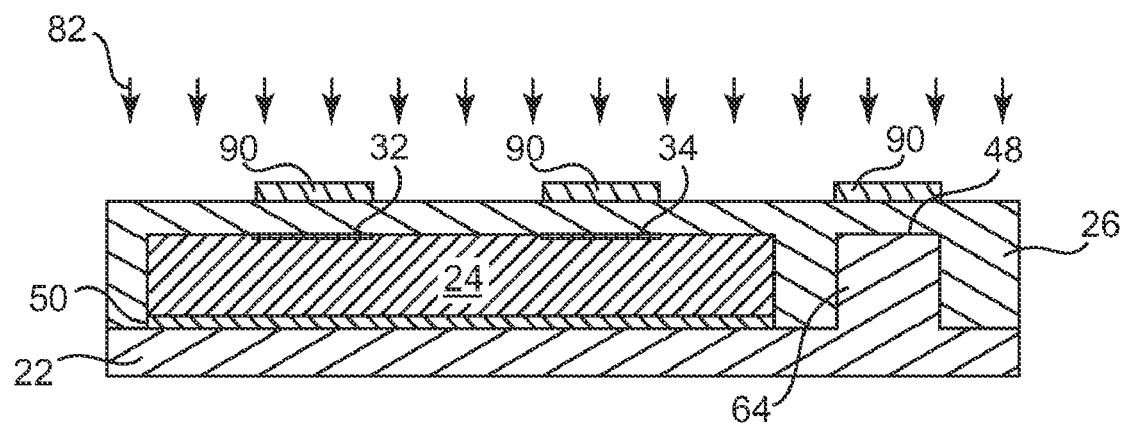
FIG. 5B is a schematic cross-sectional view of a positive photoresist applied to the dielectric layer and illuminated to photostructure the dielectric layer according to one embodiment.

FIG. 5B is a schematic cross-sectional view of a positive photoresist mask 90 patterned on the dielectric layer 26 according to one embodiment. Positive photoresist mask 90 is configured to become more soluble in the developer solution after exposure to the ultraviolet light 82. The exposure to the ultraviolet light 82 changes the chemical structure of the positive photoresist mask 90 and configures it to be washed away by the developer solution, thus leaving windows or openings that expose contacts 32, 34 and portion 48 of carrier 22. In other words, with the positive photoresist mask 90 "whatever shows, goes." Positive photoresist mask 90 provides an exact copy of the pattern to be formed in the dielectric layer 26 (as shown in FIG. 6).

Figure 6:
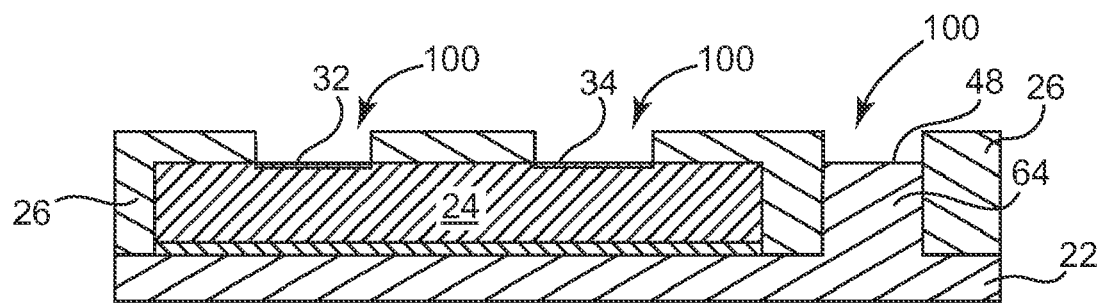
FIG. 6 is a schematic cross-sectional view of the dielectric layers of FIGS. 5A and 5B photostructured to form openings exposing contacts on the chip and a portion of the carrier according to one embodiment.

FIG. 6 is a schematic cross-sectional view of dielectric layer 26 patterned to include openings 100 above contacts 32, 34 of chip 24 and planar portion 48 of carrier 22.

Figure 7:
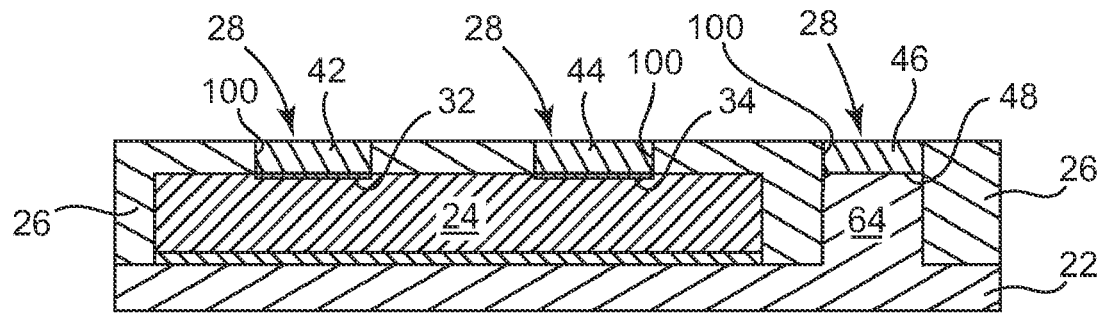
FIG. 7 is a schematic cross-sectional view of conducting elements disposed in the openings formed above the contacts on the chip and the carrier according to one embodiment.

FIG. 7 is a schematic cross-sectional view of conducting elements 28 deposited into openings 100 that have been patterned in dielectric layer 26. In one embodiment, conducting elements 28 are deposited in a galvanic process in which metal is deposited into openings 100 to form first conducting element 42 connected to contact 32, second conducting element 44 connected to contact 34, and third conducting element 46 connected to planar portion 48 of pillar 64.

Figure 8A:
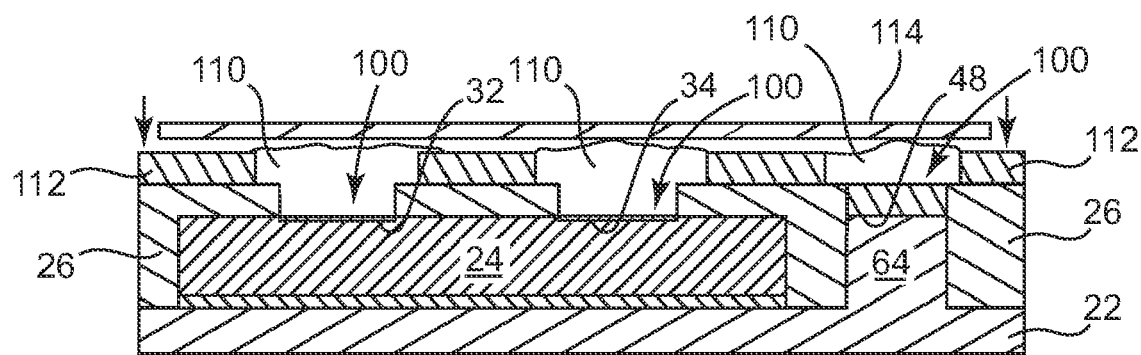
FIG. 8A is a schematic cross-sectional view of a conducting paste packed into the openings formed above the contacts of the chip and the carrier according to one embodiment.

FIG. 8A is a schematic cross-sectional view of an electrically conductive paste 110 deposited into the openings 100 formed in the dielectric layer 26 according to one embodiment. In one embodiment, a form 112 is provided to receive the conductive paste 110. The form 112 provides a pattern for the conductive paste 110. Press 114 is employed to press the conductive paste 110 firmly into the openings 100.

Suitable conductive pastes include silver pastes, copper pastes, gold pastes, aluminum paste, pastes of metal alloy where the alloys are formed of copper, aluminum, silver, and/or gold.

Figure 8B:
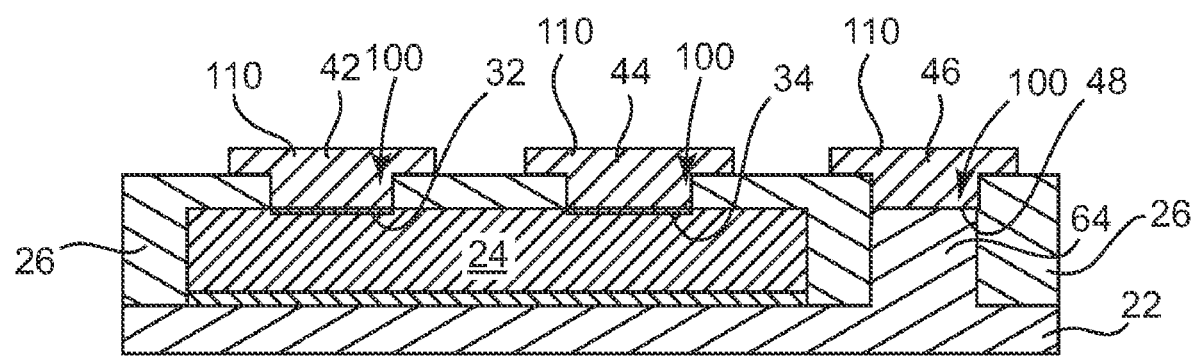
FIG. 8B is a schematic cross-sectional view of conducting elements formed from the electrically conductive paste of FIG. 8A that are connected to the contacts of the chip and the carrier according to one embodiment.

FIG. 8B is a schematic cross-sectional view of the conductive paste 110 solidified in the openings 100. In one embodiment, the form 112 (FIG. 8A) is removed along with excess conductive paste 110, thus leaving the cured conductive paste 110 in the shape of conducting elements 42, 44, 46 connected to chip 24 and carrier 22.

Figure 9:
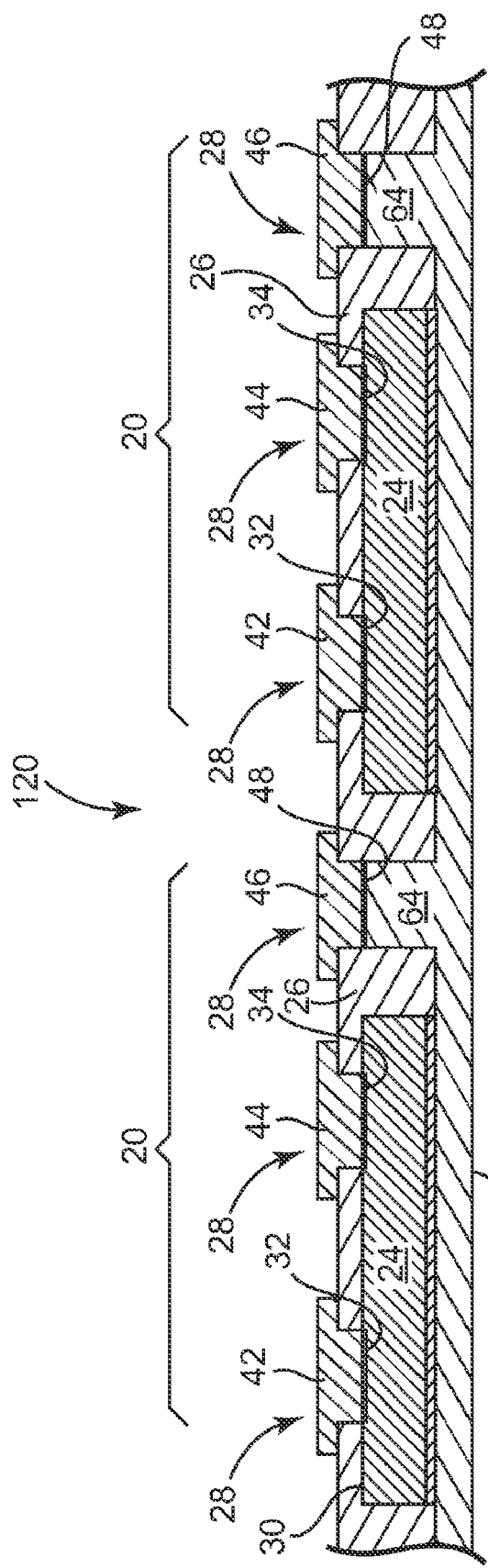
FIG. 9 is a schematic cross-sectional view of an assembly of integrated power packages according to one embodiment.

FIG. 9 is a schematic cross-sectional view of an assembly 120 of integrated power packages 20 according to one embodiment. Embodiments described above are suitable to be employed with a carrier 22 that provides a plurality of chip pads, with each chip pad having a chip 24 attached. In one embodiment, carrier 22 includes a plurality of chips pads, each adjacent to one of the pillars 64. Dielectric layer 26 or insulator 26 is deposited over carrier 22 and chips 24 to fill the voids between contacts 32, 34, and pillar 64. Insulator 26 includes a suitable photoinitiator, such as one of the photoinitiators described above, which is configured to selectively open insulator 26 to expose carrier 22 and contacts 32, 34. Suitable conducting elements 28 are disposed in the openings 100 that are formed in the dielectric layer 26.

Embodiments described above provide a semiconductor device including a dielectric layer configured to simultaneously expose multiple contacts on multiple chips and portions of the carrier supporting the chips. Simultaneously opening the dielectric layer to expose the contacts provides an economically efficient process for electrically connecting the chips and the carrier. The connections formed by connecting the conducting elements to the contacts of the chip and the carrier have lower electrical resistance and produce less thermal heating, both of which are attributes of improved semiconductor power packages.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of integrated semiconductor power devices as discussed herein. Therefore, it is intended that this invention be limited only by the claims and the equivalents thereof.

What is claimed is:

1. A semiconductor device comprising:
   a carrier;
   a chip coupled to the carrier, the chip comprising a first face with a first contact spaced apart from a second contact;
   a dielectric layer coupled to the carrier and the chip and comprising a photoinitiator that configures the dielectric layer to be selectively opened to expose the carrier and the first and second contacts; and
   a first conducting element connected to the first contact, a second conducting element connected to the second contact, and a third conducting element connected to the carrier,
   wherein the carrier comprises a vertical pin and the third conducting element is connected to the vertical pin.

2. The semiconductor device of claim 1, wherein the dielectric layer electrically separates the first and second contacts and the vertical pin.

3. The semiconductor device of claim 1, wherein the carrier comprises a leadframe and an upper surface of the vertical pin is substantially coplanar with the first and second contacts.

4. The semiconductor device of claim 3, wherein the vertical pin comprises a drain that is integrally formed with the leadframe.

5. The semiconductor device of claim 1, wherein the dielectric layer comprises a monolithic foil capped over the carrier and the chip.

6. An assembly of integrated power packages, the assembly comprising:
   a carrier comprising a base including a plurality of chip pads;
   a plurality of chips, each chip comprising a first surface configured to be coupled to one of the chip pads and a second surface comprising a first contact spaced from a second contact to define a void between the first and second contacts; and
   an insulator deposited over the carrier and the plurality of chips to cover the contacts and fill the voids between the contacts, the insulator comprising a photoinitiator configured to be selectively opened to expose a portion of the carrier and the contacts; and
   a plurality of conducting elements extending through the insulator and forming lateral connection with an opened portion of the carrier and each of the contacts of the second surfaces of the chips.

7. The semiconductor device of claim 1, wherein the carrier comprises a laminated substrate.

8. The semiconductor device of claim 1, wherein the carrier comprises a metal carrier.

9. The semiconductor device of claim 1, wherein the chip comprises at least one contact on a second face of the chip opposite the first face.

10. The semiconductor device of claim 9, wherein the second face of the chip is soldered to the carrier.

11. The semiconductor device of claim 9, wherein the second face of the chip is glued to the carrier with an electrically conducting glue.

12. The semiconductor device of claim 9, wherein the second face of the chip is coupled to the carrier via an electrically conductive adhesive tape.

13. The semiconductor device of claim 1, wherein the first conducting element, the second conducting element, and the third conducting element each comprise a conductive paste.

14. The semiconductor device of claim 1, wherein the first conducting element, the second conducting element, and the third conducting element each extend at least partially over the dielectric layer.

15. The semiconductor device of claim 1, wherein the chip comprises a metal oxide semiconductor field effect transistor chip.

16. The semiconductor device of claim 1, wherein the chip comprises a logic chip.

17. The semiconductor device of claim 1, wherein the chip comprises a power chip.

18. The assembly of claim 6, wherein the carrier comprises a leadframe including integrally formed drain pins each extending from the base of the leadframe adjacent to one of the chip pads.

19. The assembly of claim 18, wherein an upper surface of each of the drain pins is substantially planar with the first and second contacts of the chips.

20. The assembly of claim 6, wherein the insulator comprises a monolithic foil thermally formed over the carrier and the plurality of chips.

* * * * *